United States Patent [19]
Nakamura et al.

[11] Patent Number: 5,288,515
[45] Date of Patent: Feb. 22, 1994

[54] VAPOR DEPOSITION METHOD AND APPARATUS FOR PRODUCING AN EL THIN FILM OF UNIFORM THICKNESS

[75] Inventors: Noriaki Nakamura; Hiroyuki Shimoyama, both of Nara; Kinichi Isaka, Yamatokoriyama; Akio Inohara, Osaka; Hiroshi Kishishita, Nara, all of Japan

[73] Assignee: Sharp Kabushiki Kaisha, Osaka, Japan

[21] Appl. No.: 15,289

[22] Filed: Feb. 8, 1993

Related U.S. Application Data

[63] Continuation of Ser. No. 748,005, Aug. 21, 1991, abandoned.

[30] Foreign Application Priority Data

Aug. 24, 1990 [JP] Japan .................................. 2-224016
Nov. 26, 1990 [JP] Japan .................................. 2-324615

[51] Int. Cl.$^5$ .......................... B05D 5/12; C23C 16/00
[52] U.S. Cl. .................................. 427/58; 427/248.1; 118/720; 118/725
[58] Field of Search ............... 427/248.1, 58; 118/720, 118/725

[56] References Cited

U.S. PATENT DOCUMENTS

| | | | |
|---|---|---|---|
| 3,610,202 | 10/1971 | Sussmann ............................. | 118/48 |
| 4,377,405 | 3/1983 | Brandt et al. ........................ | 65/136 |
| 4,962,374 | 10/1990 | Fujioka et al. . | |
| 5,025,133 | 6/1991 | Tsutahara et al. ................... | 219/462 |

*Primary Examiner*—Shrive Beck
*Assistant Examiner*—Bret Chen

[57] ABSTRACT

There is provided a vapor deposition method for depositing a deposition material of an evaporation source on a substrate while a temperature of the substrate is uniformly kept. The method is implemented in a vapor deposition apparatus in which the evaporation source comprising the deposition material is opposed to the substrate in a vacuum chamber, a heater for heating the substrate is provided across the substrate from the evaporation source in the vacuum chamber and an equalizing plate is provided between the substrate and the heater. In addition, the equalizing plate is larger in size than the substrate and its thermal conductivity is 200 $W \cdot m^{-1} \cdot K^{-1}$ or more and an infrared energy emissivity is 0.2 or more.

6 Claims, 8 Drawing Sheets

FIG. 6

| Sample No | Material of equalizing plate | Surface treatment | Infrared emissivity | Luminance distribution (First time)→(After second time) | |
|---|---|---|---|---|---|
| 1 | SUS | Nothing | 0.2 | △ | × |
| 2 | SUS | Surface roughening (Rmax 25 μm) | 0.35 | △ | × |
| 3 | Cu | Nothing | 0.05 | — | — |
| 4 | Cu | Surface roughening (Rmax 20 μm) | 0.25 | ○ | × |
| 5 | Cu | Oxidation | 0.8 | — | — |
| 6 | Cu | SUS plates are superposed | — | △ | × |
| 7 | Al | Nothing | 0.05 | — | — |
| 8 | Al | Oxidation | 0.2 | ○ | ○ |
| 9 | Al | Surface roughening (Rmax 30 μm) | 0.2 | ○ | △ |
| 10 | Al | Oxidation after roughening surface | 0.4～0.7 | ○ | ○ |
| 11 | Al | Coating with insulating film after roughening surface 0.1 μm | — | ○ | △ |
| 12 | Al | Coating with insulating film after roughening surface 1 μm | — | ○ | ○ |

VAPOR DEPOSITION METHOD AND APPARATUS FOR PRODUCING AN EL THIN FILM OF UNIFORM THICKNESS

This application is a continuation, of application Ser. No. 07/748,005 filed on Aug. 21, 1991, now abandoned.

BACKGROUND OF THE INVENTION

1. Field of the Invention

The present invention relates to a vapor deposition method and, more particularly, to a vapor deposition method for forming a thin film having uniform distribution of thickness on a substrate.

2. Description of the Prior Art

Conventionally, a vapor deposition method for forming an electroluminescent (EL) thin film is sometimes implemented in an apparatus shown in FIG. 10. In this apparatus, an evaporation source 11 comprising a deposition material such as zinc sulfide (ZnS), whose deposition rate depends on a temperature of a substrate, is opposed to the substrate 12 of an EL element in a vacuum chamber. In this vacuum chamber provided are heaters 14 and 16 apart from the substrate 12. In addition, a reflecting plate 13 is provided close to the substrate on the side opposite to the evaporation source 11. The substrate 12 is heated up by the heaters 14 and 16 and the reflecting plate 13 adjusts a quantity of heat transmitted from the heaters 14 and 16 to the substrate 12 by reflecting infrared rays. Then, the deposition material of the evaporation source 11 is deposited on the substrate 12 while a temperature of the substrate 12 is uniformly kept at approximately 250° C. As shown in FIG. 9, when the substrate temperature is Ts to 250° C., every time the substrate temperature Ts changes by 1° C., the EL thin film thickness changes by approximately 1%. A material of the reflecting plate 13 is stainless steel SS, so that it does not react with the deposition material. In addition, since the reflecting plate 13 has a specular surface, the infrared rays from the heaters 14 and 16 are effectively reflected thereon.

Referring to the EL thin film formed by the above-described vapor deposition method, uniformity of the film thickness is sufficient for a thin film EL element with non-gradation display (monochrome display) but it is not sufficient for a thin film EL element with 16-gradation display. The reason for this is that allowable distribution of the film thickness on the substrate when 16-gradation display function is implemented is ±2% and further it is preferably ±1% in order to improve display grade while it is approximately ±5% in a case of the thin film EL element with non-gradation display. In addition, in the 16-gradient in which non-luminous state is at B0 level and brightest luminous state is at B15 level, the above ±2% is determined so that a luminance distribution at B1 level (referred to as B1 level luminance distribution hereinafter) of a darkest luminous state may be 40% or more. As described above, according to the conventional vapor deposition method, the EL thin film can not satisfy that level of the 16-gradation display and uniformity of the film thickness is not sufficient.

It is an object of the present invention to provide a vapor deposition method in which uniformity of thickness of a thin film to be formed can be improved and the level of the 16-gradation display can be satisfied when the EL thin film is formed.

SUMMARY OF THE INVENTION

According to the present invention, there is provided a vapor deposition method for depositing a deposition material of an evaporation source on a substrate while a temperature of the substrate is uniformly kept, said method being implemented in a vapor deposition apparatus in which the deposition material serving as the evaporation source whose deposition rate depends on the temperature of the substrate is opposed to the substrate in a vacuum chamber, a heater for heating the substrate is provided apart from the substrate on the other side of the evaporation source in the vacuum chamber and an equalizing plate for adjusting a quantity of heat transmitted from the heater to the substrate is provided close to the substrate, said equalizing plate being larger in size than the substrate, and its thermal conductivity being 200 $W \cdot m^{-1} \cdot K^{-1}$ or more and an infrared energy emissivity is 0.2 or more.

Further, according to another aspect of the present invention, there is provided a vapor deposition method using an equalizing plate larger in size than the substrate and having more surface roughness of a part other than the center of said equalizing plate which is opposed to the substrate than that of the center thereof.

BRIEF DESCRIPTION OF THE DRAWINGS

FIG. 6 is a table showing a change of the luminance distribution after several vapor depositions.

DESCRIPTION OF THE PREFERRED EMBODIMENTS

The present invention was made in view of the following consideration and analysis.

Figure 8:
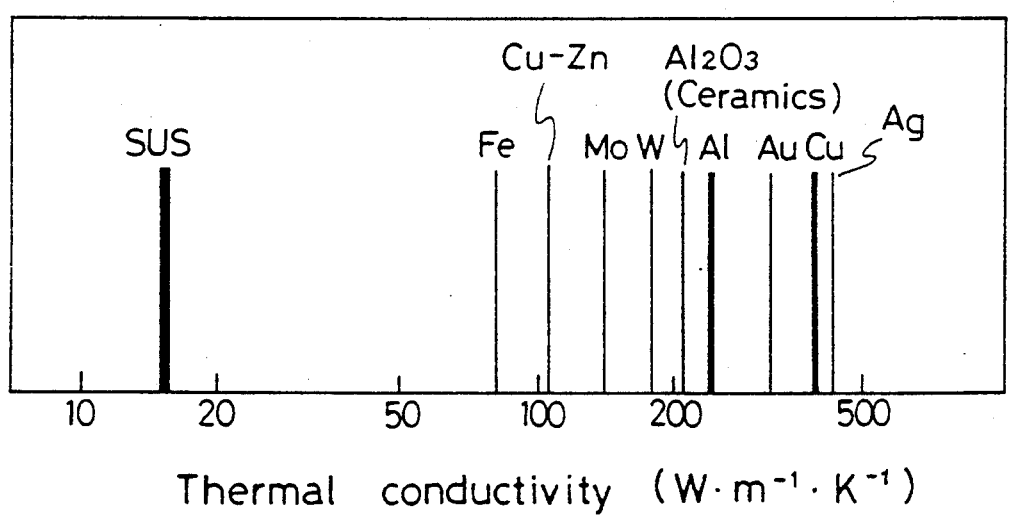
FIG. 8 is a graph showing a thermal conductivity of each of several materials.
Figure 9:
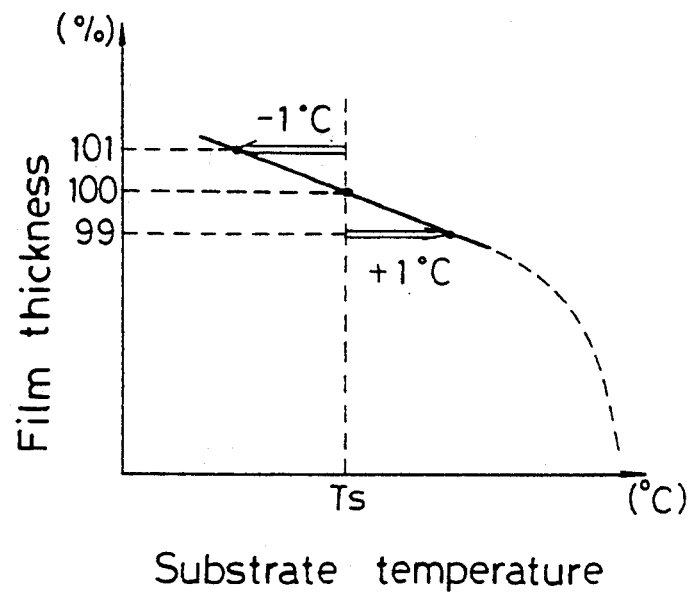
FIG. 9 is a graph showing the relation between a substrate temperature and a thickness of the EL thin film.
Figure 10:
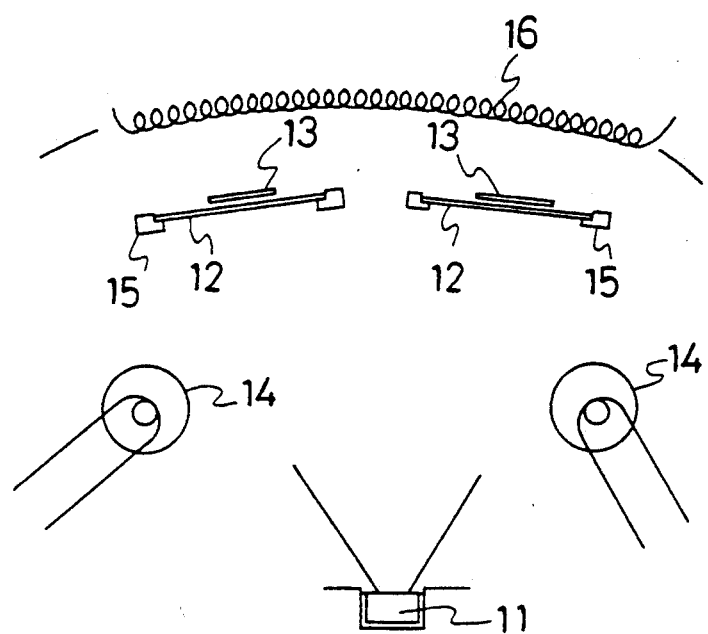
FIG. 10 is a view showing an example of a structure of a vapor deposition apparatus in which a conventional vapor deposition method is implemented.

First, description will be given of a thermal conductivity of an equalizing plate. When the thermal conductivity of the equalizing plate is high, temperature distribution of the equalizing plate is uniform. In addition, since this equalizing plate is larger in size than the substrate and it is close to the substrate, it serves as a good hot bath to the substrate. Therefore, uniformity of the substrate temperature is improved and then uniformity of thickness of the EL thin film is improved. On the other hand, when the thermal conductivity is low, heat is considerably radiated at a peripheral part of the equalizing plate (a junction part with a substrate holder), so that a temperature at the center of the equalizing plate is different from that of the peripheral part. Thus, uniformity of the film thickness is degraded. Actually, when the thermal conductivity of the equalizing plate is 200 $W \cdot m^{-1} \cdot K^{-1}$ or more, for example when the plate is formed of Al (whose thermal conductivity is 233 $W \cdot m^{-1} \cdot K^{-1}$), Cu (whose thermal conductivity is 381 $W \cdot m^{-1} \cdot K^{-1}$) or the like shown in FIG. 8, uniformity of the film thickness is improved and if other conditions are satisfied at the same time, the B1 level luminance distribution can be 40% or more. On the other hand, when the thermal conductivity is below 200 $W \cdot m^{-} \cdot K^{-1}$, for example when the equalizing plate is formed of SS (whose thermal conductivity is 25 $W \cdot m^{-1} \cdot K^{-1}$), the B1 level luminance distribution is 40% or less.

Next, description will be given of an infrared energy emissivity (referred to as only "emissivity" hereinafter) $\epsilon$ of the equalizing plate. Generally, the higher a temperature of a material surface is, the higher infrared energy radiated from the material is. However, even if the temperature is the same, an energy quantity differs depending on a nature or a surface condition of the material. The emissivity $\epsilon$ shows the degree of radiation of the infrared energy. When the emissivity $\epsilon$ is high, an influence $\Delta\epsilon$ by a surface condition (for example, a stain, a scar or attachment or oxidation of a deposition material) of the equalizing plate becomes small relative to the emissivity $\epsilon$, so that the uniformity of thickness of the EL thin film is improved. On the other hand, when the emissivity $\epsilon$ is low, the influence $\Delta\epsilon$ by subtle variation of the surface condition of the equalizing plate becomes large relative to the emissivity $\epsilon$, so that the uniformity of thickness of the film is lowered. Actually, when the emissivity $\epsilon$ if the equalizing plate is 0.2 or more and the thermal conductivity is 200 $W \cdot m^{-1} \cdot K^{-1}$ or more, the B1 level luminance distribution is 40% or more. On the other hand, the emissivity $\epsilon$ is 0.2 or less, the B1 level luminance distribution is 40% or less.

In addition, the rougher the surface of the material forming the equalizing plate is, the more its emissivity $\epsilon$ is. When the surface roughness (maximum height) $R_{max}$ is 20 $\mu m$ or more, the emissivity $\epsilon$ when a material such as Al or Cu whose thermal conductivity is 200 $W \cdot m^{-1} \cdot K^{-1}$ or more is used can be 0.2 or more. On the other hand, when the surface roughness $R_{max}$ is below 20 $\mu m$, the emissivity $\epsilon$ of the material such as Al or Cu is 0.2 or less, so that it can not be used as the equalizing plate.

In addition, when the material of the equalizing plate is Al and oxidation treatment is performed on the surface thereof, the surface can be chemically stable. Therefore, the surface of the equalizing plate is not likely to react with an element, e.g. sulfer of the deposition material. Thus, the emissivity $\epsilon$ is not likely to change and then its uniformity can be kept. As a result, even if vapor depositions are performed several times, the luminance distribution of the EL thin film can be preferably kept.

Further, when the surface of the material of the equalizing plate is coated with an insulating film, the surface is chemically stable like the above case and then it is not likely to react with the element S. Therefore, the emissivity $\epsilon$ is not likely to change and then its uniformity can be kept. As a result, even if vapor depositions are performed several times, the luminance distribution of the EL thin film can be preferably kept.

A vapor deposition method of the present invention will be described in detail hereinafter. A case where an EL thin film mainly comprising ZnS is formed on a substrate and the thin film EL element with 16-gradation display function is formed will be described.

Figure 1:
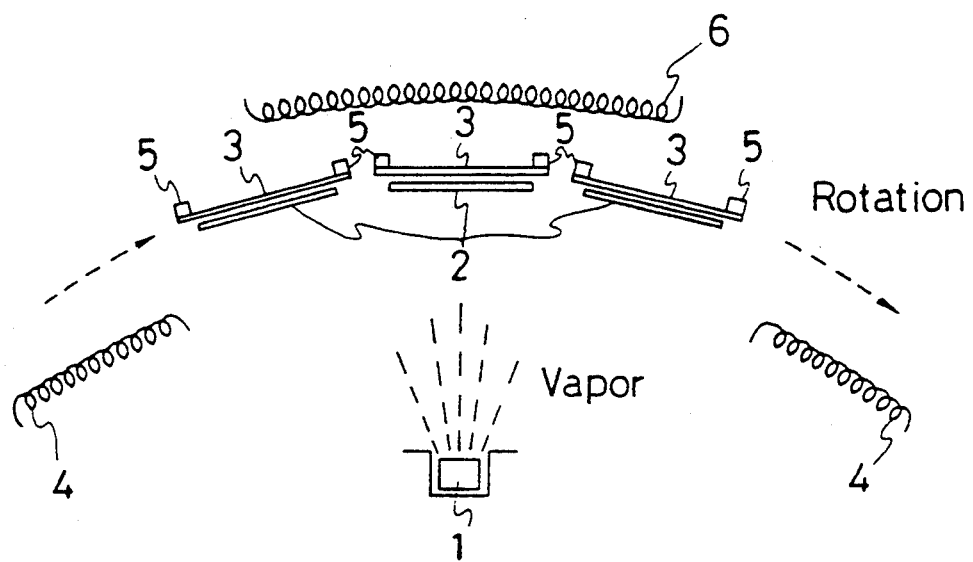
FIG. 1 is a view showing an example of a structure of a vapor deposition apparatus in which a vapor deposition method of the present invention is implemented.
Figure 2:
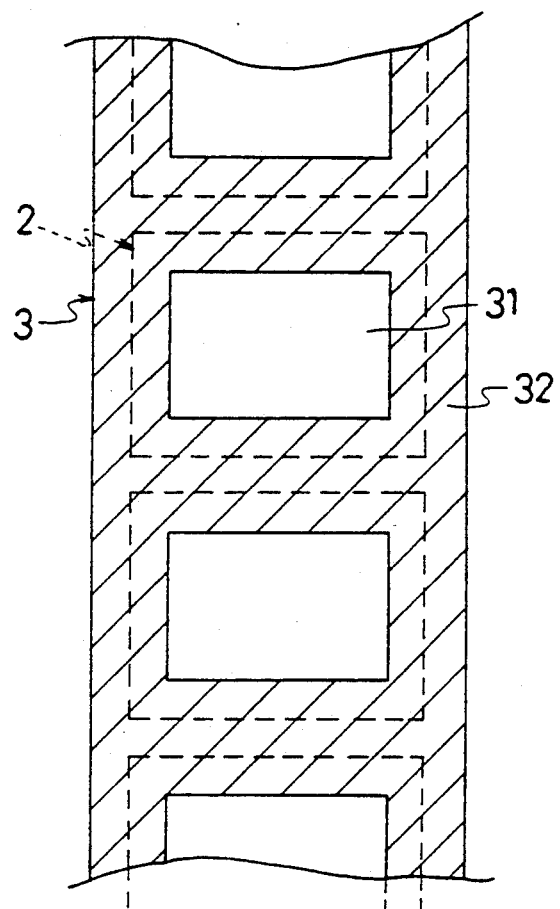
FIG. 2(a) is a view showing an equalizing plate of the vapor deposition apparatus in detail.
FIG. 2(b) is a view showing distribution of thickness of an EL thin film formed by the vapor deposition method of the present invention and distribution of thickness of an EL thin film formed by the conventional vapor deposition method.
Figure 2:
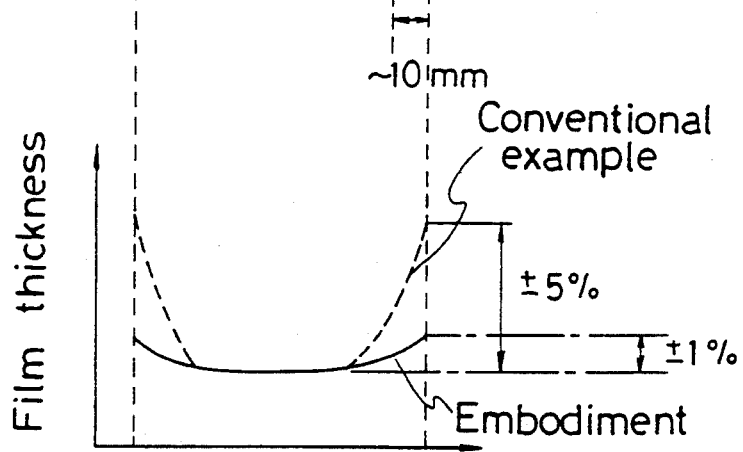

First, a brief description is given of an EL thin film light emitting element and its voltage-luminance characteristic in reference to U.S. Pat. No. 4,962,374. FIG. 1 in the U.S. Pat. No. 4,962,374 is a view showing a thin film EL element. Referring to FIG. 1, a ZnS:Mn light emitting layer 4 is formed on a glass substrate 1, which is sandwiched by upper and lower transparent insulating films 3 and 3' and further supported by electrodes 2 and 5. When an a.c. electric field is applied to the upper and lower electrodes 2 and 5, the EL element emits yellow-orange light. A film thickness of the ZnS:Mn light emitting layer ranges from 6,000 Å (angstrom) to 10,000 Å. FIG. 2 in the U.S. Pat. No. 4,962,374 shows the relation between an applied voltage and luminance. A luminance level B1 shows the darkest luminous state which corresponds to approximately an applied voltage of 180 V in FIG. 2. The above is the fundamental structure of the EL thin film light emitting element and the voltage-luminance characteristic.

FIG. 1 is a view showing a vapor deposition apparatus used for forming the EL thin film. According to the apparatus, a evaporation source 1 comprising a deposition material ZnS is opposed to EL element substrates 2 horizontally arranged at the upper part in a vacuum chamber. The substrate 2 is in contact with an equalizing plate 3 for adjusting a quantity of heat transmitted to the substrate 2 or it is set a little apart from the plate and the equalizing plate 3 is attached to a holder frame 5. The equalizing plate 3 is larger in size than the substrate 2 and it is arranged opposite the substrate from the evaporation source 1 so that vapor deposition to the substrate 2 may not be prevented. In addition, heaters 4 and 6 are provided apart from the substrate 2 in the vacuum chamber. The heater 4 is provided opposite the substrate 2 from the evaporation source 1 and the heater 6 is provided on the opposite side thereof. The heaters 4 and 6 heat the substrate 2 from both sides of the substrate 2 and a temperature Ts of the substrate 2 can be raised at Ts to 250° C. as in the conventional example. The equalizing plate 3 adjusts the quantity of heat transmitted from the heaters 4 and 6 to the substrate 2 and uniformly keep the temperature Ts of the substrate 2. In addition, the substrate 2 moves around the evaporation source 1 at speed of 0.1 to 10 RPM integrally with the equalizing plate 3 and the holder frame 5 during vapor deposition as shown by a dotted line in FIG. 1.

As shown in FIG. 2(a), the equalizing plate 3 has rough coating on the surface facing the substrate 2 so that surface roughness $R_{max}$ of a peripheral part 32 (a part shown by slanting line in FIG. 2(a)) other than the center 31 may be 10 $\mu m$ or more and about 20 to 30 $\mu m$. The center 31 is a plane surface whose surface roughness $R_{max}$ is 1 $\mu m$ or less.

A width of a frame-shaped part of the peripheral part 32 which is opposed to the substrate 2 is set at approximately 10 mm.

As the result of various examinations of a material and surface treatment of the equalizing plate 3, the following conclusion is obtained referring to the relation between the thermal conductivity, the emissivity (an infrared energy emissivity) $\epsilon$ and the B1 level luminance distribution of the equalizing plate 3. In addition, the emissivity $\epsilon$ was measured using a radiation thermometer IRAL made by CHINO corporation and a thermoviewer TVM made by NIPPON AVIONICS Co., Ltd.

Figure 3:
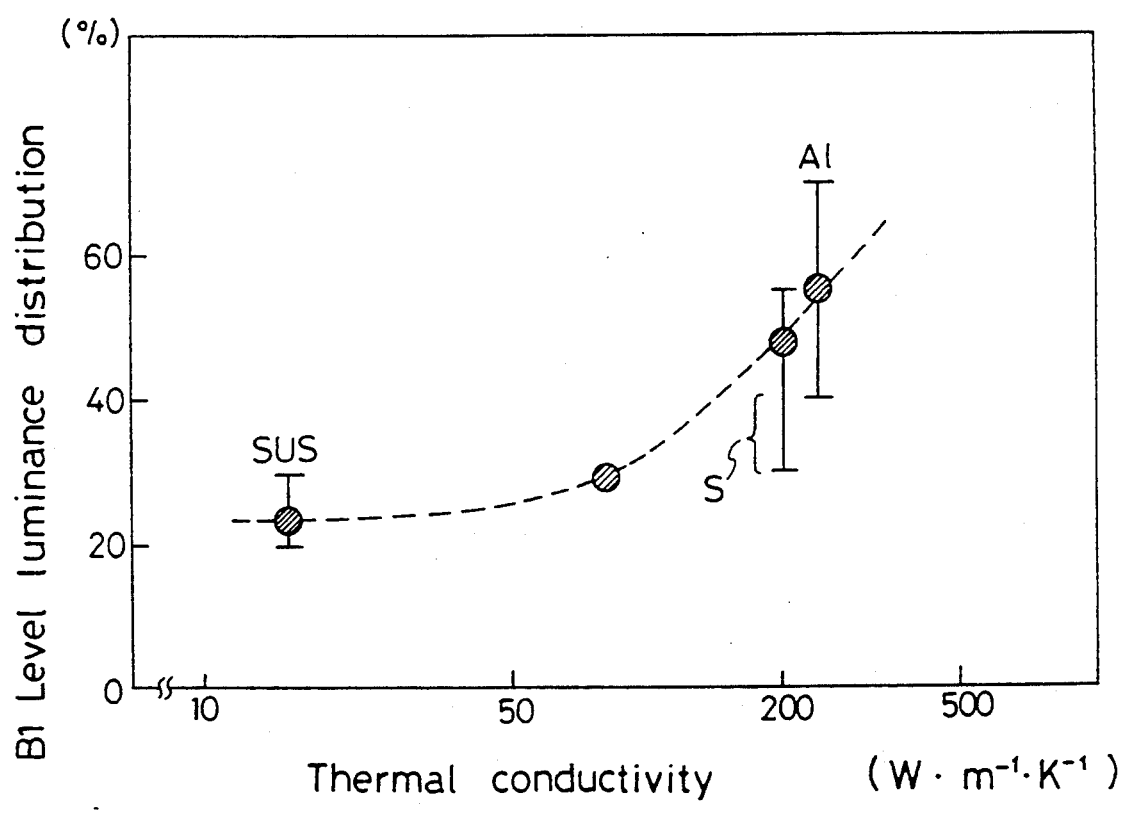
FIG. 3 is a graph showing the relation between a thermal conductivity and B1 level luminance distribution of the equalizing plate of the vapor deposition apparatus.
Figure 4:
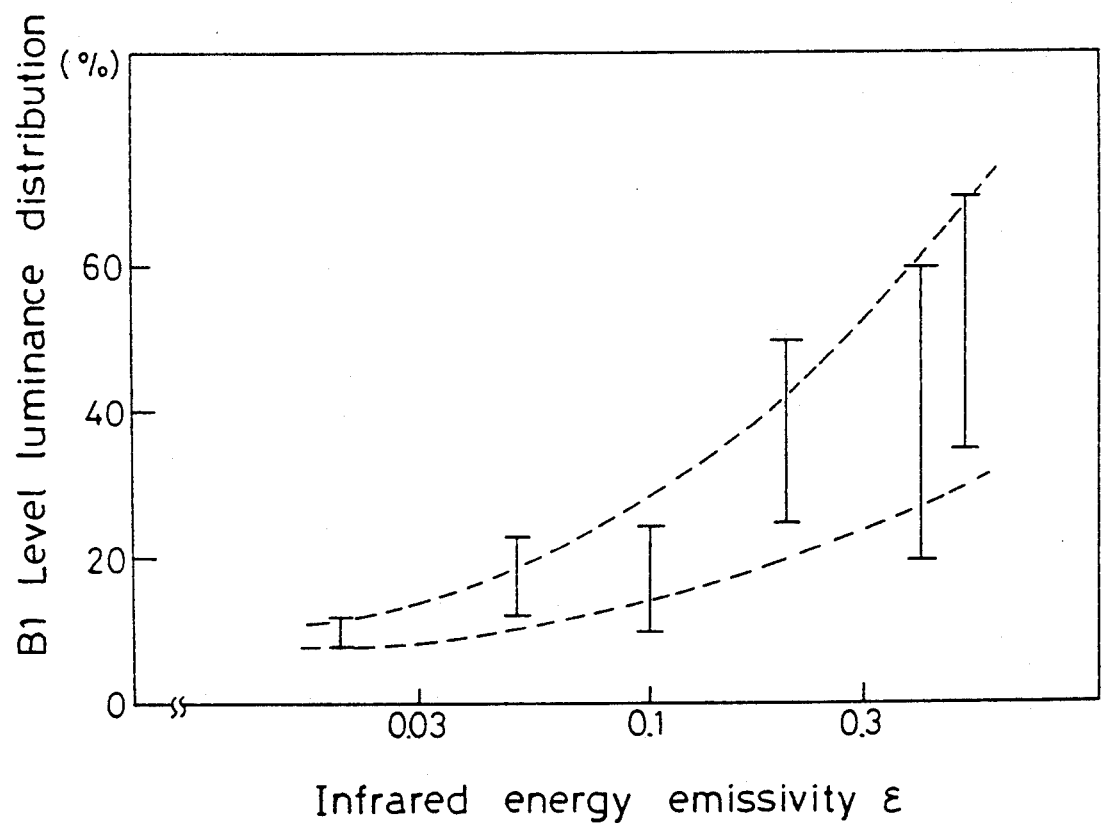
FIG. 4 is a graph showing the relation between an emissivity $\epsilon$ and the B1 level luminance distribution of the equalizing plate.

First, the relation between the thermal conductivity and the B1 level luminance distribution is a positive correlation, that is, the more the thermal conductivity is, the more the B1 level luminance distribution is as shown in FIG. 3. The reason for this is the temperature distribution of the equalizing plate becomes uniform when the thermal conductivity of the equalizing plate 3 is high. In addition, since the equalizing plate 3 is larger in size than the substrate 2 and the equalizing plate 3 is close to the substrate 2, it is considered that the equalizing plate 3 serves as a good hot bath to the substrate 2. More specifically, uniformity of the substrate temperature is improved and then the uniformity of thickness of the formed EL thin film is improved. As a result, the B1 level luminance distribution is improved. Referring to a central value of the data (shown by ◯ in FIG. 3), when the thermal conductivity is 200 W·m$^{-1}$·K$^{-1}$ or more, the B1 level luminance distribution is 40% or more. Referring to dispersion of the data when the thermal conductivity is 200 W·m$^{-1}$·K$^{-1}$, some of the B1 level luminance distribution is below 40% (shown by S in FIG. 3). Then, it is found that this dispersion is caused by dispersion of the emissivity $\epsilon$. The relation between the emissivity $\epsilon$ and the B1 level luminance distribution is as follows, that is, the more the emissivity $\epsilon$ is, the more the B1 level luminance distribution is as shown in FIG. 4. When the emissivity $\epsilon$ of the equalizing plate 3 is high, an influence $\Delta\epsilon$ by the dispersion of the surface condition of the equalizing plate 3 becomes small relative to the emissivity $\epsilon$ and then the uniformity of thickness of the formed EL thin film is improved, so that the B1 level luminance distribution is improved. On the contrary, when the emissivity $\epsilon$ is small, the influence $\Delta\epsilon$ by subtle dispersion of the surface condition of the equalizing plate 3 becomes large relative to the emissivity $\epsilon$ and then the uniformity of the thickness is lowered and then the B1 level luminance distribution is degraded. In fact, when the thermal conductivity is 200 W·m$^{-1}$·K$^{-1}$ and the emissivity $\epsilon$ is 0.2 or more, the B1 level luminance distribution can be 40% or more. In addition, if either one of those conditions is not satisfied, the B1 level luminance distribution is below 40%.

Further, since the surface roughness $R_{max}$ of the peripheral part 32 other than the center 31 is larger than the surface roughness $R_{max}$ of the center 31 of the equalizing plate 3 as described above, an infrared emissivity of the peripheral part 32 of the equalizing plate 3 is higher than the infrared emissivity of the center 31 of the equalizing plate 3. Therefore, the peripheral part of the substrate 2 in which heat is likely to radiate as compared with the center of the substrate 2 can be irradiated with more infrared rays. Thus, according to this embodiment the present invention, the uniformity of the temperature distribution of the substrate 2 can be improved and the thickness distribution of the formed EL thin film can be improved from ±5% of the conventional example to ±1% as shown in FIG. 2(b). As a result, there can be provided the E1 thin film of 16-gradation display with high-grade display function.

In addition, even if surface roughness $R_{max}$ of the center 31 of the equalizing plate 3 is the same as that of the peripheral part 32 thereof, if the plate has rough coating on the surface so that the surface roughness $R_{max}$ may be 10 $\mu$m or more and about 20 to 30 $\mu$m, uniformity of temperature distribution of the substrate 2 can be considerably improved as compared with the conventional example.

In addition, a transparent glass substrate is selected as a substrate. Data shown in FIGS. 2 to 4 and FIG. 10 of the present invention is provided when the substrate is formed of glass.

A thickness of the glass substrate for the EL element is approximately 0.7 to 2 mm. Thermal conductivity of the glass substrate is approximately 5 to 11 W·m$^{-1}$·K$^{-1}$ which is lower than that of SS (stainless steel).

Figure 5:
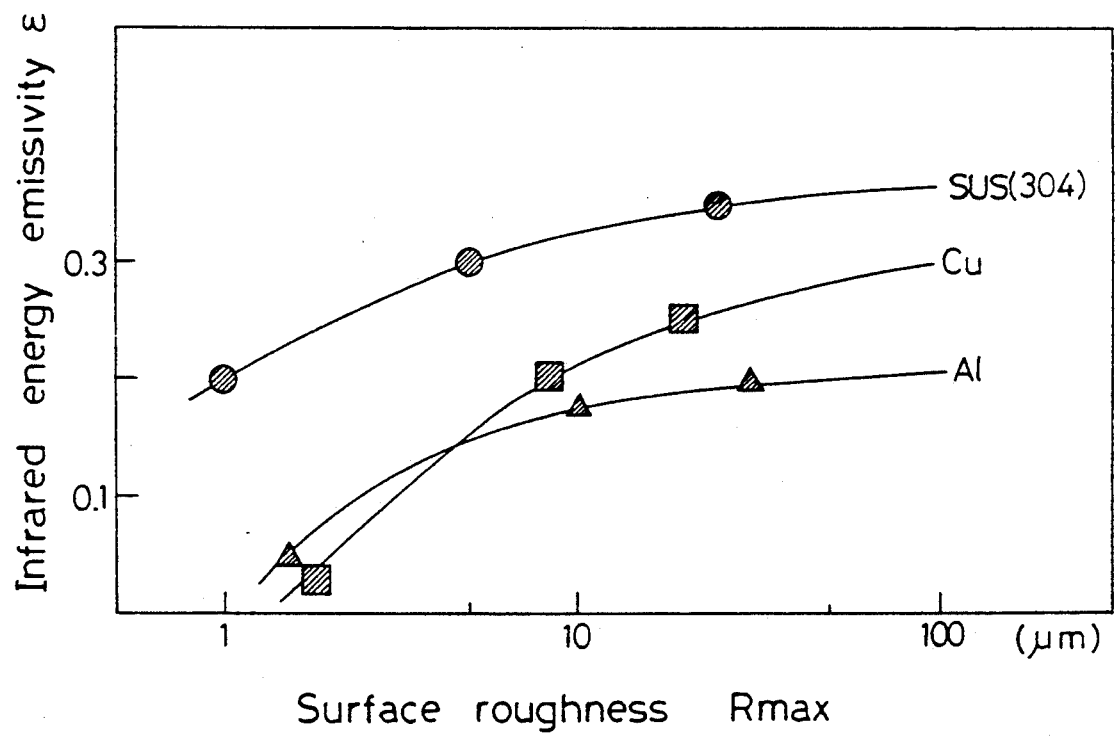
FIG. 5 is a graph showing the relation between surface roughness $R_{max}$ and the emissivity $\epsilon$ of the equalizing plate.
Figure 7:
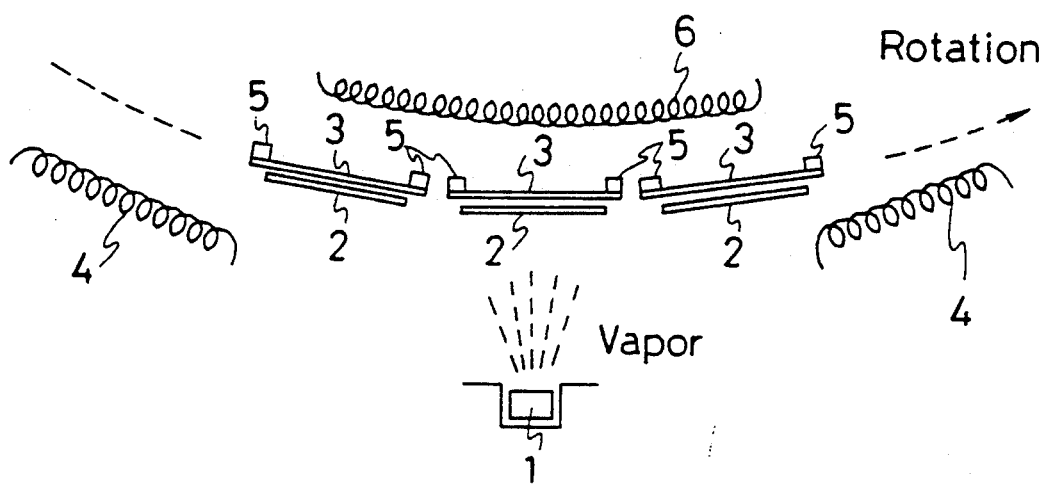
FIG. 7 is a view showing another example of a structure of the vapor deposition apparatus.

Next, a method for roughening the surface of the equalizing plate 3 will be described. As means for roughening the surface, polishing by sand paper, shot blasting and liquid honing were tried. As a result, the liquid honing is used because a large area can be uniformly roughened by that method. Conditions of the liquid honing are set as follows. That is, a type of an anti-friction material such as SiC so that the surface may be formed like the teeth of a saw. Since the surface is like the tooth of a saw, when a vapor deposition film is attached, it is not likely to come off and dust is not likely to generate. Alternatively, when the anti-friction material is glass beads, the surface has gentle wave-formed irregularity, so that the attached film is likely to come off. A grain type of the anti-friction material is #60 (its average is 250 $\mu$m). In addition, an air pressure when the anti-friction material is applied is approximately 5 Kg/cm$^2$. The equalizing plate 3 is formed of three kinds of materials such as SS304, Cu and Al while the surface roughness $R_{max}$ ranges from 1 to 30 $\mu$m and then the result shown in FIG. 5 is obtained. That is, referring to all materials, the more the surface roughness $R_{max}$ is, the more the emissivity $\epsilon$ is. Particularly, when the surface roughness $R_{max}$ is 20 $\mu$m or more, the emissivity $\epsilon$ of Al can be 0.2 or more (one of conditions to make the B1 level luminance distribution 40% or more).

In a case where vapor depositions are performed several times using the equalizing plate 3 having a roughened surface, although a comparatively good luminance distribution can be obtained at the first vapor deposition, it becomes worse after the second time. FIG. 6 shows that result. Referring to FIG. 6, the left half shows the surface treatment performed on the material of the equalizing plate 3 and the right half shows the relation between the emissivity $\epsilon$ and the luminance distribution. In the section of the luminance distribution, marks of ◯, △ and X show that the luminance distribution is good, comparatively bad and bad, respectively. In addition, sample No. 1, 2, 4, 6, 9 and 11 show that the luminance distribution becomes worse after the second time. The reason for this is that a vapor deposition film (ZnS) is attached onto the peripheral part of the equalizing plate 3 which is not covered with the substrate 2. In addition, the reason is that the vapor deposition film is also attached on a part covered with the substrate 2 in a case where the substrate 2 is set apart from the equalizing plate 3. As a result, the emissivity $\epsilon$ varies from the set value. Particularly, when the equalizing plate 3 is formed of Cu (in a case of the sample No. 4 and 6), the following reaction, that is, $$Cu + S \rightarrow CuS$$

occurs between Cu and S which was formed through thermal decomposition of ZnS, whereby the emissivity $\epsilon$ is increased and the luminance distribution is considerably degraded.

Then, the inventor of the present invention tried performing oxidation treatment or coating an insulating film on the surface of the material forming the equalizing plate 3. As a result, when the equalizing plate 3 was formed of Al, a good result was obtained in a case where oxidation treatment was performed after the surface was roughened (sample No. 10) and a case where an insulating film ($Si_3N_4$ film) having a thickness of 1 $\mu$m was applied by sputtering after the surface was roughened ($R_{max}$=20 to 30 $\mu$m) (sample No. 12). Meanwhile, in a case where only the oxidation treatment was performed without roughening the surface, although the luminance distribution was good, the vapor deposition film attached on the surface of the equalizing plate 3 came off after it was used several times, which became dust and attached on the substrate surface, causing a damage to the film. Further, in a case only the film thickness was different from the sample No. 12 (sample No. 11 and its thickness is 0.1 $\mu$m), irregularity of the surface could not be sufficiently covered and then a good result could not be obtained.

Further, although there are several methods for oxidizing the surface of Al such as thermal oxidation in the air, oxygen plasma treatment, anodic oxidation or the like, the anodic oxidation (so-called alumite treatment) is preferable because a large area can be uniformly treated with ease at a low price by that method. In addition, as a method for coating the insulating film, since the thickness of 1 $\mu$m is sufficient, a CVD method, a dipping method or a coating method which are excellent in coverage are preferable.

Although the substrate 2, the equalizing plate 3 and the like move round the evaporation source 1 in the above embodiment of the present invention, the evaporation source 1 may be arranged outside the circumference of the circle formed by the substrate 2 and the equalizing plate 3.

In addition, although the glass substrate is used as the substrate for vapor deposition in the above embodiment of the present invention, it is not limited to the glass substrate and the present invention can be applied to a material having different thermal conductivity, such as a ceramic substrate, a plastic substrate or stainless substrate having low thermal conductivity.

As can be apparent from the above description, according to a vapor deposition method of the present invention, an equalizing plate is provided close to the substrate, which plate is larger in size than the substrate and whose thermal conductivity is 200 $W \cdot m^{-1} \cdot K^{-1}$ and an emissivity $\epsilon$ is 0.2 or more, so that uniformity of thickness of the thin film to be formed can be improved and the level of 16-gradation display of the thin film EL element can be satisfied.

In addition, when the material of the equalizing plate has surface roughness ($R_{max}$) of 20 $\mu$m or more, an emissivity $\epsilon$ of the material such as Al or Cu whose thermal conductivity is 200 $W \cdot m^{-1} \cdot K^{-1}$ or more can be 0.2 or more.

Further, in a case where the material for the equalizing plate is formed of Al whose surface has oxidation treatment, or whose surface is coated with an insulating film, even if vapor depositions are performed several times, the luminance distribution of the EL thin film can be preferably kept.

Still further, when the equalizing plate is larger in size than the substrate and its surface roughness at a part other than the center which is opposed to the substrate is larger than that at the center, an infrared emissivity at the part other than the center of the equalizing plate is larger than that at the center thereof. Thus, the peripheral part of the substrate where heat is likely to radiate as compared with the center of the substrate can be irradiated by more infrared rays. As a result, uniformity of temperature of the substrate can be further improved and uniformity of thickness of an EL thin film can be more improved.

While only certain presently preferred embodiments have been described in detail, as will be apparent with those skilled in the art, certain changes and modifications can be made without departing from the scope of the invention as defined by the following claims.

What is claimed is:

1. A vapor deposition method comprising the steps of:
   (a) depositing a deposition material of an evaporation source on a substrate, in a vacuum chamber;
   (b) heating the substrate; and
   (c) adjusting the heat transmitted to the substrate to provide uniform heating over an entire area of the substrate in order to produce an electroluminescent film with an overall thickness variation of less than 1%, suitable for use in a multi-gradation display, using an equalizing plate larger in area than the substrate, with a thermal conductivity of at least 200 $W \cdot m^{-1} \cdot K^{-1}$ and an infrared energy emissivity of at least 0.2.

2. The vapor deposition method of claim 1, wherein the equalizing plate has a surface roughness ($R_{max}$) of at least 20 $\mu$m.

3. The vapor deposition method of claim 2, wherein the equalizing plate is composed of oxidized aluminum.

4. The vapor deposition method of claim 2, wherein the surface of the equalizing plate is coated with an insulating film.

5. A vapor deposition method comprising the steps of:
   (a) depositing a deposition material of an evaporation source on a substrate in a vacuum chamber;
   (b) heating the substrate; and
   (c) adjusting the heat transmitted to the substrate to provide uniform heating over an entire area of the substrate in order to produce an electroluminescent film with an overall thickness variation of less than 1%, suitable for use in a multi-gradation display, using an equalizing plate larger in area than the substrate, with an outer portion of the equalizing plate having greater surface roughness than a center portion of the equalizing plate.

6. The vapor deposition method of claim 5, wherein a thermal conductivity of the equalizing plate is at least 200 $W \cdot m^{-1} \cdot K^{-1}$ and an infrared energy emissivity of the equalizing plate is at least 0.2.

* * * * *